United States Patent
Sandhu et al.

(10) Patent No.: US 9,053,801 B2
(45) Date of Patent: Jun. 9, 2015

(54) MEMORY CELLS HAVING FERROELECTRIC MATERIALS

(71) Applicant: Micron Technology, Inc., Boise, ID (US)

(72) Inventors: Gurtej S. Sandhu, Boise, ID (US); D.V. Nirmal Ramaswamy, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 235 days.

(21) Appl. No.: 13/690,957

(22) Filed: Nov. 30, 2012

(65) Prior Publication Data

US 2014/0153312 A1 Jun. 5, 2014

(51) Int. Cl.
| | |
|---|---|
| *H01L 45/00* | (2006.01) |
| *G11C 13/00* | (2006.01) |
| *G11C 11/22* | (2006.01) |
| *H01L 49/02* | (2006.01) |
| *H01L 27/24* | (2006.01) |

(52) U.S. Cl.
CPC .................. *G11C 11/22* (2013.01); *H01L 28/55* (2013.01); *G11C 13/0007* (2013.01); *G11C 13/0069* (2013.01); *H01L 45/08* (2013.01); *H01L 45/12* (2013.01); *H01L 45/1233* (2013.01); *H01L 45/145* (2013.01); *H01L 45/146* (2013.01); *H01L 45/1616* (2013.01); *H01L 27/2463* (2013.01); *G11C 2213/54* (2013.01); *G11C 2213/55* (2013.01)

(58) Field of Classification Search
CPC .......................... H01L 45/08; G11C 13/0007
USPC .................. 257/2–5, 295, E45.001–E45.003, 257/E29.272, E27.004, E27.104; 365/145, 365/148
See application file for complete search history.

(56) References Cited

U.S. PATENT DOCUMENTS

| | | | |
|---|---|---|---|
| 8,003,511 B2 | 8/2011 | Rinerson et al. | |
| 8,031,510 B2* | 10/2011 | Schloss et al. | 365/148 |
| 8,208,284 B2 | 6/2012 | Schloss | |
| 2009/0057737 A1* | 3/2009 | Boescke et al. | 257/295 |
| 2010/0159641 A1* | 6/2010 | Rinerson et al. | 438/104 |
| 2011/0291066 A1 | 12/2011 | Baek et al. | |
| 2011/0297927 A1 | 12/2011 | Ramaswamy et al. | |
| 2012/0126195 A1* | 5/2012 | Ignatiev et al. | 257/2 |
| 2012/0211716 A1 | 8/2012 | Meyer | |

OTHER PUBLICATIONS

Boscke, et al, "Ferroelectricity in Hafnium Oxide: CMOS Compatible Ferroelectric Field Effect Transistors," Dec. 5-7, 2011, pp. 24.5.1-24.5.4, IEEE.

* cited by examiner

*Primary Examiner* — Allison P Bernstein
(74) *Attorney, Agent, or Firm* — Brooks, Cameron & Huebsch, PLLC

(57) ABSTRACT

Memory cells having ferroelectric materials and methods of operating and forming the same are described herein. As an example, a memory cell can include a first electrode and a second electrode, and an ion source and a ferroelectric material formed between the first electrode and the second electrode, where the ferroelectric material serves to stabilize storage of ions transitioned from the ion source.

24 Claims, 2 Drawing Sheets

MEMORY CELLS HAVING FERROELECTRIC MATERIALS

TECHNICAL FIELD

The present disclosure relates generally to semiconductor memory apparatuses and methods, and more particularly to memory cells having ferroelectric materials.

BACKGROUND

Memory devices are utilized as non-volatile memory for a wide range of electronic applications in need of high memory densities, high reliability, and data retention without power. Non-volatile memory may be used in, for example, personal computers, portable memory sticks, solid state drives (SSDs), digital cameras, cellular telephones, portable music players such as MP3 players, movie players, and other electronic devices.

Memory devices are typically provided as internal, semiconductor, integrated circuits in computers or other electronic devices. There are many different types of memory, including random-access memory (RAM), read only memory (ROM), dynamic random access memory (DRAM), synchronous dynamic random access memory (SDRAM), flash memory, and resistance variable memory, among others. Types of resistance variable memory include phase change random access memory (PCRAM) and resistive random access memory (RRAM), for instance.

Resistance variable memory devices can include a resistance variable material that can be programmed into different resistance states to store data. The particular data stored in such a memory cell can be read by sensing the cell's resistance, e.g., by sensing current and/or voltage variations.

DETAILED DESCRIPTION

Figure 1:
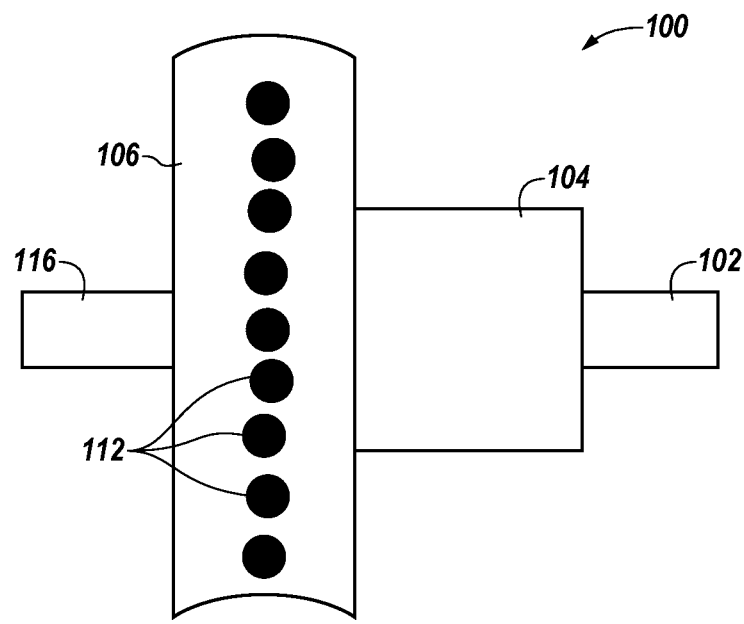
FIG. 1 illustrates a cross-sectional view of a portion of a prior art resistance variable memory cell.

Memory cells having ferroelectric materials and methods of operating and forming the same are described herein. In a number of embodiments, a memory cell can include a first electrode and a second electrode, and an ion source and a ferroelectric material formed between the first electrode and the second electrode, where the ferroelectric material serves to stabilize storage of ions transitioned from the ion source.

Embodiments of the present disclosure can provide benefits such as reducing a tendency of ionic species, e.g., oxygen ions, transitioned from a source material, e.g., a mixed valence oxide (MVO), to a tunnel barrier material and/or an insulating metal oxide (IMO) material to drift back toward and/or into the source material. As such, stabilizing the ionic species in the tunnel barrier and/or the IMO in a programmed state can help to enable a more stable and/or reliable memory device.

Embodiments of the present disclosure are described in detail with reference to the accompanying figures. It should be noted that, although the figures may illustrate only one memory cell, the semiconductor structures contemplated herein can have more than one memory cell. In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

The figures herein follow a numbering convention in which the first digit or digits correspond to the drawing figure number and the remaining digits identify an element or component in the drawing. Similar elements or components between different figures may be identified by the use of similar digits. For example, 105 may reference element "05" in FIG. 1, and a similar element may be referenced as 205 in FIG. 2. As will be appreciated, elements shown in the various embodiments herein can be added, exchanged, and/or eliminated so as to provide a number of additional embodiments of the present disclosure. In addition, the proportion and the relative scale of the elements provided in the figures are intended to illustrate various embodiments of the present invention and are not to be used in a limiting sense.

FIG. 1 illustrates a cross-sectional view of a portion of a prior art resistance variable memory cell. The memory cell 100 illustrated in FIG. 1 can, for instance, include two electrodes 102 and 116 with an oxygen source 104, e.g., a MVO, and a tunnel barrier 106, e.g., an IMO, between the two electrodes 102 and 116. The memory cell 100 can be operated, e.g., programmed, by applying a positive voltage across the electrodes 102 and 116, e.g., applying the positive voltage to electrode 116, to cause negatively charged oxygen ions 112 from the oxygen source 104 to transition to the tunnel barrier 106, e.g., in a programming operation. A negative voltage can be applied across the electrodes 102 and 116, e.g., applying the negative voltage to electrode 116, to cause negatively charged oxygen ions 112 to transition from the tunnel barrier 106 to the oxygen source 104, e.g., in an erase operation.

A resistivity of the memory cell 100 may be dependent on the oxygen ion location and/or number, e.g., charge magnitude. The resistivity may change as the location of the oxygen ions and/or the number of ions changes, either in the tunnel barrier 106 and/or in the oxygen source 104. Therefore, the state, e.g., resistance, of the memory cell 100 can change depending on the location of and/or the number of the oxygen ions 112. The state of the memory cell 100 can be read, for example, by applying a read voltage across the electrodes 102 and 116 of the memory cell 100.

In such memory cells, stability, e.g., retention, of the oxygen ions in the tunnel barrier and/or the oxygen source can determine the ability of the memory device to maintain a state. A memory cell that exhibits unstable retention of the oxygen ions in the tunnel barrier may not be reliable in maintaining an "on" state or an "off" state for the memory cell. In contrast, a memory cell that can stably retain the oxygen ions in the tunnel barrier may have greater reliability in maintaining the "on" state or the "off" state. Memory cells having enhanced stability in retaining a location of transitioned ions can be formed in accordance with a number of embodiments as described herein, e.g., as illustrated in FIGS. 2 and 3.

Figure 2:
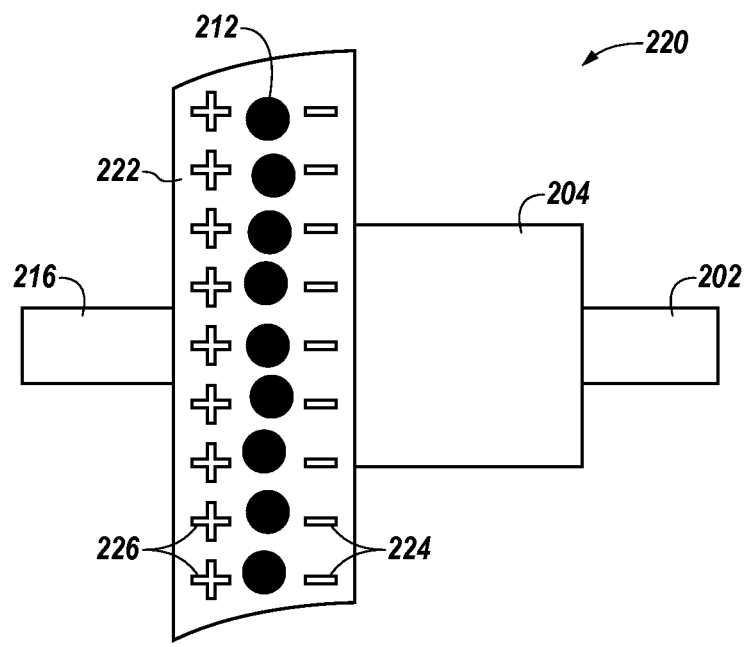
FIG. 2 illustrates a cross-sectional view of a portion of a resistance variable memory cell formed in accordance with a number of embodiments of the present disclosure.
Figure 3:
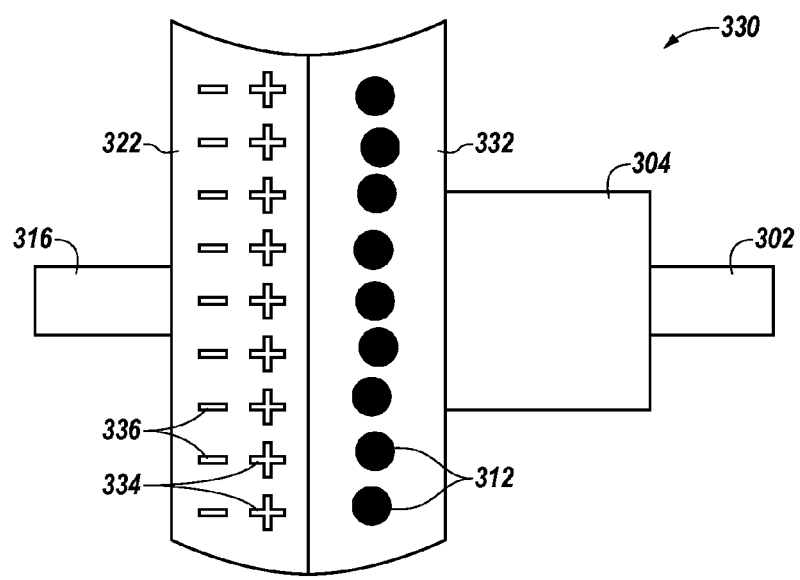
FIG. 3 illustrates a cross-sectional view of a portion of a resistance variable memory cell formed in accordance with a number of embodiments of the present disclosure.

FIG. 2 illustrates a cross-sectional view of a portion of a resistance variable memory cell formed in accordance with embodiments of the present disclosure. The memory cell 220 illustrated in FIG. 2 can be used in electrical systems and can, for example, include two electrodes 202 and 216. An ion source 204, e.g., an oxygen source such as a MVO, and a tunnel barrier 222 at least partially formed from a ferroelectric material, e.g., an IMO at least partially formed from a ferroelectric material, can be formed between the two electrodes 202 and 216.

The memory cell 220 can be operated, e.g., programmed, by applying a voltage across the electrodes 202 and 216. For example, a positive voltage can be applied to electrode 216 to cause negative ions 212, e.g., oxygen ions, to transition from the ion source 204, e.g., the oxygen source, to the tunnel barrier 222 having the ferroelectric material. A negative voltage can be applied across the electrodes 202 and 216, e.g., applying the negative voltage to electrode 216, to cause the negative ions 212 to transition from the tunnel barrier 222 to the ion source 204. e.g., in an erase operation. In a number of embodiments of the present disclosure, the ferroelectric material, e.g., as shown at 222 in FIG. 2 and at 322 in FIG. 3, can serve to form a gate dielectric for operation of the memory cells 220 and 330.

As described herein, a dipole orientation of the ferroelectric material can be switched by application of a voltage pulse that is smaller in magnitude and/or shorter in duration than a voltage used for transitioning ions within and/or between the ion source 204 and the tunnel barrier 222 at least partially formed from the ferroelectric material. For example, a small and/or short positive voltage pulse can be applied to electrode 202 or a small and/or short negative voltage pulse can be applied to electrode 216 in order to orient the dipole of the ferroelectric material in the tunnel barrier 222 such that a negative pole 224 is adjacent the ion source 204 and a positive pole 226 is adjacent the electrode 216. Orientation of the dipole of the ferroelectric material as such can be effectuated before and/or after application of a voltage sufficient to transition the ions 212 to the tunnel barrier 222.

As illustrated in FIG. 2, when negative ions 212, e.g., oxygen ions, are transitioned from the ion source 204, e.g., an oxygen source such as a MVO, the negative ions 212 become located in the tunnel barrier 222 between the negative pole 224 adjacent the ion source 204 and the positive pole 226 adjacent the electrode 216. The negative ions 212 will tend to be attracted toward the positive pole 226 adjacent the electrode 216 and/or will tend to be repelled from the negative pole 224 adjacent the ion source 204. As such, the negative ions 212 will tend not to drift back toward and/or into the ion source 204.

Accordingly, the retention of the negative ions 212, e.g., oxygen ions, in the tunnel barrier 222 is stabilized by the ferroelectric material forming at least a part thereof. In some embodiments, positive ions can also be transitioned from an ion source by applying a negative voltage or positive voltage to the appropriate electrode and can be similarly stabilized in a tunnel barrier at least partially formed from a ferroelectric material, e.g., an IMO at least partially formed from a ferroelectric material.

Hafnium silicon oxide (HfSiOx) is an example of a ferroelectric material. By way of example and not by way of limitation, a ferroelectric HfSiOx can be formed when a HfOx based thin film, at a composition where a tetragonal phase is not yet stable, is crystallized in the presence of a cap. For example, HfSiOx can be deposited by an atomic layer deposition (ALD) process based on Tetrakis-(ethylmethylamino)-hafnium (TEMA-Hf), Tetrakis dimethylamino-silane (4DMAS), metal organic precursors, and ozone. Silicon (Si) content can be defined by varying a cycle ratio of the precursors and monitored by secondary ion mass spectrometry and elastic recoil detection analysis on samples without thermal treatment. A crystallization temperature of above 500° C. can be used for thin films, e.g., 5-25 nanometers (nm) thick, formed with Si, e.g., using a composition range of 2.5-6 mol % $SiO_2$. In various embodiments, titanium nitride (TiN) electrodes, for example, can be formed, e.g., deposited, on the HfSiOx as the cap by a chemical vapor deposition (CVD) process based on $TiCl_4$ and $NH_3$. Portions of memory cells can, for example, be formed in a gate first scheme with a gate stack consisting of a thermal $SiO_2$ interface, a ferroelectric HfSiO insulator, and a TiN electrode. Crystallization of the HfSiOx thin films can, for example, be induced by a 1000° C. for 20 seconds anneal in nitrogen after cap electrode deposition.

By lowering a deposition temperature of the TiN top electrode below a crystallization temperature of the HfSiOx, amorphous films can be induced to crystallize in a subsequent thermal treatment step above the crystallization temperature. Electrical polarization measurements on capped HfSiOx films at different compositions show a gradual transition from ferroelectric to antiferroelectric polarization curves with increasing silicon content. The ferroelectric samples show piezoelectric behavior, which is a prerequisite for ferroelectricity. X-ray diffraction measurements of uncapped films show a tetragonal/monoclinic mixture, as is commonly observed for crystalline thin films. Capped samples, however, show a diffraction pattern indicating orthorhombic crystallization of the HfSiOx. Orthorhombic crystallization lattices can be pictured as resulting from stretching a cubic lattice along two of its three orthogonal axes by two different factors, yielding a rectangular orthogonal crystal with a rectangular base with a length a and a width b along with a height c, where a, b, and c each have distinct values. Orthorhombic ferroelectric materials can exhibit a stable charge dipole with an orientation that is switchable by application of an electric field.

Examples of oxides (e.g., compounds ending in Ox) provided herein can include a near-stoichiometric, a stoichiometric, and/or a sub-stoichiometric ratio for the oxygen atoms relative to the other atoms of the compound. Moreover, the stoichiometries of the non-oxygen atoms can vary dependent upon a number of factors. For instance, as just described, the Si content of the HfSiOx ferroelectric material can be defined by, for example, varying a composition range of $SiO_2$ from 2.5-6 mol %.

FIG. 3 illustrates a cross-sectional view of a portion of a resistance variable memory cell formed in accordance with embodiments of the present disclosure. The memory cell 330 illustrated in FIG. 3 can be used in electrical systems and can, for example, include two electrodes 302 and 316. An ion source 304, e.g., an oxygen source such as a MVO, a non-ferroelectric tunnel oxide material 332, and a ferroelectric material 322, e.g., an IMO at least partially formed from a ferroelectric material, can be formed between the two electrodes 302 and 316. That is, in some embodiments, the memory cell 330 illustrated in FIG. 3 can have a non-ferroelectric tunnel oxide material 332 formed between the ion source 304 and the ferroelectric material 322, where the ferroelectric material 322 can serve to stabilize storage of ions 312 transitioned from the ion source 304 to the non-ferroelectric tunnel oxide material 332.

The memory cell 330 can be operated, e.g., programmed, by applying a voltage across the electrodes 302 and 316. For example, a positive voltage can be applied to electrode 316 to cause negative ions 312, e.g., oxygen ions, from the ion source 304, e.g., the oxygen source, to transition to the non-ferroelectric tunnel oxide material 332. A negative voltage can be applied across the electrodes 302 and 316, e.g., applying the negative voltage to electrode 316, to cause the negative ions 312 to move from the non-ferroelectric tunnel oxide material 332 to the ion source 304, e.g., in an erase operation.

As described herein, a dipole orientation of the ferroelectric material 322 can be switched by application of a voltage pulse that is smaller in magnitude and/or shorter in duration than a voltage used for transitioning ions 312 within and/or between the ion source 304 and the non-ferroelectric tunnel oxide material 332. For example, a small and/or short positive voltage pulse can be applied to electrode 316 or a small and/or short negative voltage pulse can be applied to electrode 302 in order to orient the dipole of the ferroelectric material 322 such that a negative pole 336 is adjacent the electrode 316 and a positive pole 334 is adjacent the non-ferroelectric tunnel oxide material 332. Orientation of the dipole of the ferroelectric material 322 as such can be effectuated before and/or after application of a voltage sufficient to transition the ions 312 to the non-ferroelectric tunnel oxide material 332.

As illustrated in FIG. 3, when negative ions 312, e.g., oxygen ions, are transitioned from the ion source 304, e.g., an oxygen source such as a MVO, the negative ions 312 become located in the non-ferroelectric tunnel oxide material 332 adjacent the positive pole 334 of the ferroelectric material 322. As such, the negative ions 312, e.g., oxygen ions, located in the non-ferroelectric tunnel oxide material 332 will tend to be attracted toward the positive pole 334 of the ferroelectric material 322 and will tend not to drift back toward and/or into the ion source 304. That is, the location of the negative ions 312 in the non-ferroelectric tunnel oxide material 332 will be stabilized.

Accordingly, in a number of embodiments of the present disclosure, a memory cell, e.g., 330, can be operated by applying a voltage across a material stack, e.g., 304, 332, and 322, formed between a first electrode, e.g., 302, and a second electrode, e.g., 316, to transition a number of ionic species, e.g., 312, from a source material, e.g., 304, to a non-ferroelectric tunnel oxide material, e.g., 332, positioned in series with a ferroelectric IMO material, e.g., 322, in the material stack. In a number of embodiments, the number of ionic species can include a number of oxygen ions, e.g., negative ions, that are transitioned from a MVO source material to the non-ferroelectric tunnel oxide material. In a number of embodiments, positive ions can also be transitioned from a source material by applying a negative voltage or positive voltage to the appropriate electrode and can be similarly stabilized in a non-ferroelectric tunnel oxide material adjacent a ferroelectric material, e.g., an IMO at least partially formed from a ferroelectric material. In a number of embodiments, transitioning the number of ionic species from the source material to the non-ferroelectric tunnel oxide material includes changing a resistance of the memory cell.

As described herein, in a number of embodiments, the number of ionic species, e.g., 312, transitioned to the non-ferroelectric tunnel oxide material, e.g., 332, can be stabilized by a dipole, e.g., 334 and 336, of the ferroelectric IMO material 322. For example, the number of ionic species can be stabilized by the dipole of the ferroelectric IMO material having a charge polarity adjacent the non-ferroelectric tunnel oxide material that is opposite a charge polarity of the ionic species. In a number of embodiments, the charge polarity of the dipole of the ferroelectric IMO material can be adjusted prior to the memory cell being programmed by applying the voltage across the material stack to transition the ionic species.

Figure 4:
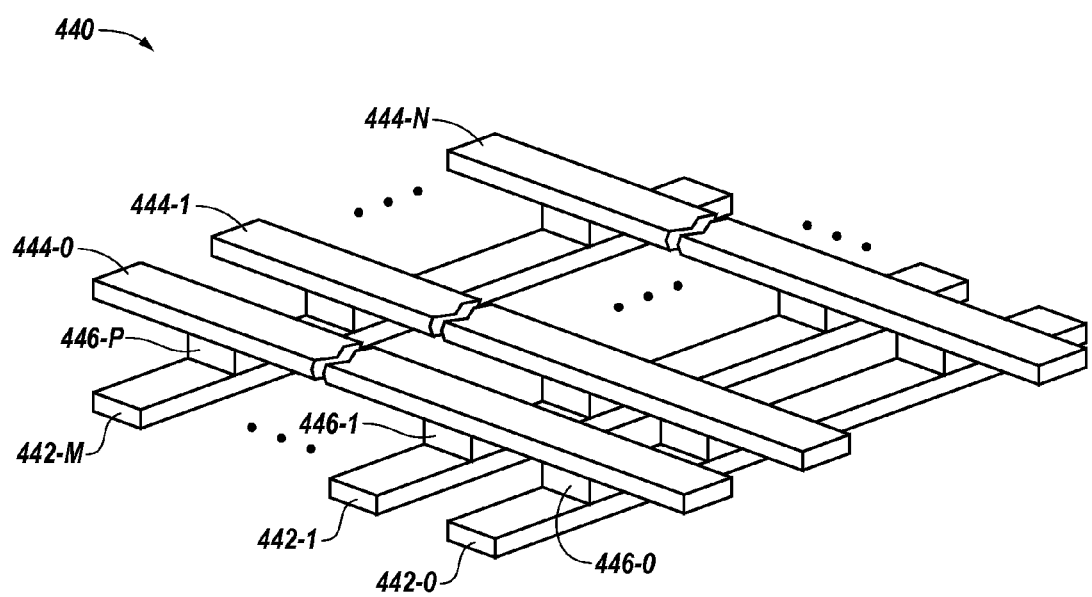
FIG. 4 is a schematic diagram of a portion of an array of resistance variable memory cells in accordance with a number of embodiments of the present disclosure.

FIG. 4 is a schematic diagram of a portion of an array of resistance variable memory cells in accordance with a number of embodiments of the present disclosure. Memory devices can include a number of memory cells 446-0, 446-1, ..., 446-P arranged in a matrix, e.g., an array 440, where each memory cell can serve as a data storage element. A memory cell may, in a number of embodiments, include the storage element being coupled to a select device, e.g., an access device. The storage element can include a programmable portion that may have a variable resistance, for example. The access device can be a diode, field effect transistor (FET), or bipolar junction transistor (BJT), among others.

In the example illustrated in FIG. 4, the array 440 is an array including a first number of conductive lines 442-0, 442-1, ..., 442-M, e.g., access lines, which may be referred to herein as word lines, and a second number of conductive lines 444-0, 444-1, ..., 444-N, e.g., data lines, which may be referred to herein as bit lines. As illustrated, the word lines 442-0, 442-1, ..., 442-M are substantially parallel to each other and are substantially orthogonal to the bit lines 444-0, 444-1, ..., 444-N, which are substantially parallel to each other; however, embodiments are not so limited.

As used herein, the term "substantially" intends that the modified characteristic need not be absolute, but is close enough so as to achieve the advantages of the characteristic. For example, "substantially parallel" is not limited to absolute parallelism, and can include structure orientations that are non-intersecting for a given application and at least closer to a parallel orientation than a perpendicular orientation.

In this example, a memory cell 446-0, 446-1, ..., 446-P is located at each of the intersections of the word lines 442-0, 442-1, ..., 442-M and bit lines 444-0, 444-1, ..., 444-N. The memory cells 446-0, 446-1, ..., 446-P can function in a two-terminal architecture, e.g., with a particular word line 442-0, 442-1, ..., 442-M and a particular bit line 444-0, 444-1, ..., 444-N serving as or connecting to a bottom electrode and a top electrode. That is, in a number of embodiments, the first conductive lines, e.g., word lines, and second conductive lines, e.g., bit lines, can serve as the first electrodes and the second electrodes, respectively, and/or the first conductive lines, e.g., word lines, and second conductive lines, e.g., bit lines, can connect to the first electrodes and the second electrodes, respectively, of the memory cells 446-0, 446-1, ..., 446-P. A memory cell may be coupled to a word line forming a "row" of the array. Each memory cell may be coupled to a bit line forming a "column" of the array. Although the memory cells 446-0, 446-1, ..., 446-P shown in FIG. 4 have a two-terminal architecture, the memory cells can be implemented in a three terminal architecture, for instance.

According to a number of embodiments, the memory cells 446-0, 446-1, ..., 446-P of array 440 can be memory cells having ferroelectric materials, such as those described in connection with FIGS. 2 and 3. In operation, the memory cells 446-0, 446-1, ..., 446-P of array 440 can be programmed by applying a voltage, e.g., a write voltage, across the memory cells 446-0, 446-1, ..., 446-P via selected word lines 442-0, 442-1, ..., 442-M and bit lines 444-0, 444-1, ..., 444-N. The width and/or magnitude of the voltage pulses across the memory cells 446-0, 446-1, ..., 446-P can be adjusted, e.g., varied, in order to program the memory cells 446-0, 446-1, ..., 446-P to particular logic states, e.g., by adjusting a resistance level of the storage element.

A sensing, e.g., read, operation can be used to determine the logic state of a memory cell 446-0, 446-1, ..., 446-P by a magnitude of sensing current, for example, on a bit line 444-0, 444-1, ..., 444-N corresponding to the respective memory cell 446-0, 446-1, ..., 446-P responsive to a particular voltage applied to the selected word line 442-0, 442-1, ..., 442-M to which the respective cell 446-0, 446-1, ..., 446-P is coupled. Sensing operations can also include biasing unselected word lines and bit lines at particular voltages in order to sense the logic state of a selected cell 446-0, 446-1, ..., 446-P.

The word lines and the bit lines can be coupled to decoding circuits formed in a substrate material formed, for example, below the array and used to interpret various signals, e.g., voltages and/or currents, on the word lines and/or the bit lines. As an example, the decoding circuits may include row decoding circuits, for decoding signals on the word lines, and column decoding circuits, for decoding signals on the bit lines.

The memory cell, e.g., 446-0, 446-1, ..., 446-P, can be formed as a material stack, e.g., as illustrated in FIG. 3 at 304, 332, and 322, including at least one MVO material, e.g., 304, formed in contact with a non-ferroelectric tunnel oxide material, e.g., 332, formed in contact with a ferroelectric IMO material, e.g., 322. In a number of embodiments, the ferroelectric IMO material, e.g., 322, can include a charge dipole, e.g., 334 and 336, e.g., a switchable charge dipole, that stabilizes storage of ions, e.g., 312, transitioned to the non-ferroelectric tunnel oxide material, e.g., 332.

As described in the present disclosure, a material stack e.g., as illustrated in FIG. 3 at 304, 332, and 322, of a memory cell, e.g., as illustrated in FIG. 3 at 330, can be formed by forming a first electrode, e.g., 302, forming an oxygen source material, e.g., 304, that is in contact with the first electrode, forming a non-ferroelectric tunnel oxide material, e.g., 332, that is in contact with the oxygen source, forming a ferroelectric material, e.g., 322, that is in contact with the non-ferroelectric tunnel oxide material, and forming a second electrode, e.g., 316, that is in contact with the ferroelectric material.

In a number of embodiments, the first electrode and/or the second electrode, e.g., 302 and 316, can be formed using CVD, ALD, and/or a damascene process, among other processes. The first electrode and/or the second electrode can be formed from materials that include copper (Cu), platinum (Pt), tungsten (W), silver (Ag), aluminum (Al), titanium nitride (TiN), tantalum nitride (TaN), tungsten nitride (WN), and/or ruthenium (Ru), among various other materials and/or combinations thereof.

In a number of embodiments, the oxygen source material, e.g., 304, can be formed from at least one MVO material. In a number of embodiments, the at least one MVO material can be selected from a group that includes a perovskite metal oxide (PMO), a lanthanum strontium manganese oxide (LaSrMnOx), a lanthanum strontium copper oxide (LaSrCuOx), a lanthanum strontium cobalt oxide (LaSrCoOx), a lanthanum calcium manganese oxide (LaCaMnOx), a lanthanum copper oxide (LaCuOx), a lanthanum cobalt oxide (LaCoOx), a lanthanum nickelate oxide (LaNiOx), a strontium titanate oxide (SrTiOx), a strontium copper oxide (SrCuOx), a strontium cobalt oxide (SrCoOx), a praseodymium calcium manganese oxide (PrCaMnOx), a praseodymium manganese oxide (PrMnOx), and a titanium oxide (TiOx), among other materials having similar attributes. The oxygen source material can be formed, e.g., deposited, using, for example, CVD and/or ALD, among other processes.

In a number of embodiments, the non-ferroelectric tunnel oxide material, e.g., 332, can be formed from at least one dielectric material selected from a group that includes a hafnium oxide (HfOx), a zirconium oxide (ZrOx), a zirconium yttrium oxide (ZrYOx), a titanium oxide (TiOx), a silicon oxide (SiOx), and an aluminum oxide (AlOx), among other materials having similar attributes. The non-ferroelectric tunnel oxide material can be formed, e.g., deposited, using, for example, CVD and/or ALD, among other processes.

In a number of embodiments, the ferroelectric material, e.g., 322, can be formed from an orthorhombic ferroelectric material, e.g., a ferroelectric IMO material. For example, the ferroelectric IMO material can be at least one orthorhombic ferroelectric material selected from a group that includes a hafnium oxide (HfOx), a hafnium silicon oxide (HfSiOx), a hafnium aluminum oxide (HfAlOx), a zirconium hafnium oxide (ZrHfOx), and a zirconium magnesium oxide (ZrMgOx), among other materials having similar attributes. The ferroelectric IMO material can be formed, e.g., deposited, using, for example, CVD and/or ALD, among other processes.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure.

It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim.

Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A memory cell, comprising:
   a first electrode and a second electrode; and
   an ion source and a tunnel barrier comprising a ferroelectric material formed between the first electrode and the second electrode,
   wherein the ferroelectric material serves to stabilize storage in the ferroelectric material of ions transitioned from the ion source.

2. The memory cell of claim 1, wherein the tunnel barrier further comprises a non-ferroelectric tunnel oxide material formed as at least part of the ferroelectric material, wherein the ferroelectric material serves to stabilize storage of ions transitioned from the ion source to the non-ferroelectric tunnel oxide material.

3. The memory cell of claim 1, wherein the ferroelectric material is formed in contact with and between the ion source and the second electrode.

4. The memory cell of claim 1, wherein the ions are oxygen ions.

5. The memory cell of claim 1, wherein the ion source comprises a mixed valence oxide formed in contact with and between the ferroelectric material and the first electrode.

6. The memory cell of claim 1, wherein ferroelectric material is a gate dielectric.

7. The memory cell of claim 1, wherein the ferroelectric material is an insulating metal oxide.

8. A memory array, comprising:
a first number of conductive lines;
a second number of conductive lines intersecting the first number of conductive lines; and
a memory cell formed between a first electrode and a second electrode at each of a number of intersections of the first number of conductive lines and the second number of conductive lines, wherein the memory cell comprises a material stack including at least one mixed valence oxide material formed in direct contact with a ferroelectric insulating metal oxide material.

9. The array of claim 8, wherein the at least one mixed valence oxide material is selected from a group that includes a perovskite metal oxide (PMO), a lanthanum strontium manganese oxide (LaSrMnOx), a lanthanum strontium copper oxide (LaSrCuOx), a lanthanum strontium cobalt oxide (LaSrCoOx), a lanthanum calcium manganese oxide (LaCaMnOx), a lanthanum copper oxide (LaCuOx), a lanthanum cobalt oxide (LaCoOx), a lanthanum nickelate oxide (LaNiOx), a strontium titanate oxide (SrTiOx), a strontium copper oxide (SrCuOx), a strontium cobalt oxide (SrCoOx), a praseodymium calcium manganese oxide (PrCaMnOx), a praseodymium manganese oxide (PrMnOx), and a titanium oxide (TiOx).

10. The array of claim 8, wherein the ferroelectric insulating metal oxide material is at least one orthorhombic ferroelectric material selected from a group that includes a hafnium oxide (HfOx), a hafnium silicon oxide (HfSiOx), a hafnium aluminum oxide (HfAlOx), a zirconium hafnium oxide (ZrHfOx), and a zirconium magnesium oxide (ZrMgOx).

11. The array of claim 8, wherein the ferroelectric insulating metal oxide material comprises a charge dipole that stabilizes storage of ions transitioned to the non-ferroelectric tunnel oxide material.

12. A method of forming a memory cell, comprising:
forming a first electrode;
forming an oxygen source material that is in contact with the first electrode;
forming a ferroelectric material that is in direct contact with the oxygen source material; and
forming a second electrode that is in contact with the ferroelectric material.

13. The method of claim 12, wherein forming the oxygen source material comprises forming at least one mixed valence oxide material.

14. The method of claim 12, wherein forming the oxygen source material comprises forming the oxygen source material using atomic layer deposition.

15. The method of claim 12, wherein forming the oxygen source material comprises forming the oxygen source material using chemical vapor deposition.

16. The method of claim 12, wherein forming the ferroelectric material comprises forming an orthorhombic ferroelectric material.

17. The method of claim 16, wherein forming the orthorhombic ferroelectric material comprises forming hafnium silicon oxide.

18. The method of claim 12, wherein forming the ferroelectric material comprises forming the ferroelectric material using atomic layer deposition.

19. The method of claim 12, wherein forming the ferroelectric material comprises forming the ferroelectric material using chemical vapor deposition.

20. A method of operating a memory cell, comprising:
applying a voltage across a material stack formed between a first electrode and a second electrode to transition a number of ionic species from an oxygen source material to a ferroelectric insulating metal oxide material in the material stack; and
wherein the number of ionic species transitioned to the ferroelectric insulating metal oxide material is stabilized between poles of a dipole of the ferroelectric insulating metal oxide material.

21. The method of claim 20, wherein a number of oxygen ions are transitioned from a mixed valence oxide source material to the ferroelectric insulating metal oxide material.

22. The method of claim 20, wherein transitioning the number of ionic species from the source material to the ferroelectric insulating metal oxide material that forms at least a part of a tunnel oxide material comprises changing a resistance of the memory cell.

23. The method of claim 20, wherein the number of ionic species in the ferroelectric insulating metal oxide material is stabilized by the dipole of the ferroelectric insulating metal oxide material having a charge polarity adjacent the oxygen source material that is a charge polarity of the ionic species.

24. The method of claim 20, wherein a charge polarity of the dipole of the ferroelectric insulating metal oxide material is adjusted prior to the memory cell being programmed by applying the voltage across the material stack.

* * * * *